United States Patent [19]

Allen

[11] Patent Number: 6,134,703
[45] Date of Patent: Oct. 17, 2000

[54] PROCESS FOR PROGRAMMING PLDS AND EMBEDDED NON-VOLATILE MEMORIES

[75] Inventor: Ernest Allen, Hillsboro, Oreg.

[73] Assignee: Lattice Semiconductor Corporation, Hillsboro, Oreg.

[21] Appl. No.: 08/996,530

[22] Filed: Dec. 23, 1997

[51] Int. Cl.[7] .......................... G06F 17/50; H03K 17/693
[52] U.S. Cl. ................................................. 716/16; 716/2
[58] Field of Search ........................ 395/500.17; 326/38; 716/16

[56] References Cited

U.S. PATENT DOCUMENTS

| | | | |
|---|---|---|---|
| 4,488,246 | 12/1984 | Brice | 364/716 |
| 5,256,918 | 10/1993 | Suzuki | 307/465 |
| 5,329,179 | 7/1994 | Tang et al. | 307/465 |
| 5,394,031 | 2/1995 | Britton et al. | 326/38 |
| 5,521,835 | 5/1996 | Trimberger | 364/489 |
| 5,526,276 | 6/1996 | Cox et al. | 364/489 |
| 5,543,730 | 8/1996 | Cliff et al. | 326/38 |
| 5,635,855 | 6/1997 | Tang | 326/38 |
| 5,684,980 | 11/1997 | Casselman | 395/500 |
| 5,861,761 | 1/1999 | Kean | 326/41 |
| 6,023,566 | 2/2000 | Belkhale et al. | 395/500.3 |
| 6,023,755 | 2/2000 | Casselman | 712/37 |

OTHER PUBLICATIONS

B. Falkowski et al., Calculation of the Rademacher–Walsh Spectrum From a Reduced Representation of Boolean Functions, 1992 Design Automation Conference, pp. 181–186, Sep. 1992.

B. Falkowski et al., Properties and Applications of Unified Complex Hadamard Transforms, 1997 Proceedings 27th International Symposium on Multiple–Valued Logic, pp. 131–136, May 1997.

*Primary Examiner*—Paul R. Lintz
*Assistant Examiner*—A. M. Thompson
*Attorney, Agent, or Firm*—Skjerven Morrill MacPherson LLP.; Edward C. Kwok

[57] ABSTRACT

A process for efficiently programming a programmable logic device (PLD) is provided. A basis set for a desired matrix of programming pattern ("pattern matrix") is a set of row patterns from which all the row patterns of the pattern matrix can be derived by applying a Boolean operation on two or more row patterns of the basis set. The disclosed process derives a minimal basis set, i.e., a set with the smallest number of row patterns among basis sets for the given pattern matrix.

7 Claims, 4 Drawing Sheets

Microfiche Appendix Included
(1 Microfiche, 58 Pages)

PROCESS FOR PROGRAMMING PLDS AND EMBEDDED NON-VOLATILE MEMORIES

CROSS REFERENCE TO APPENDIX IN ATTACHED MICROFICHE

Appendix A, which is a part of the present disclosure, is attached herewith in a microfiche consisting of a total of 1 sheet that contains a total of 58 frames. Appendix A is a listing of a computer program, which computes a minimal basis set of the "pattern matrix", which is a matrix containing rows of bit patterns (hereinafter "row patterns") used for programming a programmable logic device. The computer program, written in the C programming language, can be compiled by most C language compilers, for example, by a C compiler running on the Solaris 1.X operating system available from Sun Microsystems of Sunnyvale, Calif.

A portion of the disclosure of this patent document contains material that is subject to copyright protection. The copyright owner has no objection to the facsimile reproduction by anyone of the patent document or the patent disclosure, as it appears in the U.S. Patent and Trademark Office patent files or records, but otherwise reserves all copyright rights whatsoever.

BACKGROUND OF THE INVENTION

1. Field of the Invention

The present invention relates to non-volatile computer memories, and, in particular, to programming of programmable logic devices (PLDs).

2. Description of the Related Art

ROM (read-only memory) devices hold advantages over RAM (random access memory) devices in that (i) their stored contents are not erased upon power interruption, (ii) they are cheaper to produce, and (iii) they occupy smaller silicon real estate than RAM devices of same storage capacity. Yet, a drawback of ROM devices is that their contents cannot be changed after fabrication. PROM (programmable ROM) devices and PLDs (programmable logic (array) devices) overcome this limitation by letting the original content be written once after fabrication. EPROM (erasable PROM) devices and EPLDs (erasable PLDs) extend the writability to multiple writes.

Although EPROMs and EPLDs share a common function, an EPLD takes up a relatively smaller area for a given Boolean function to be implemented. FIG. 1 illustrates a basic structure of an EPROM 100 with a matrix of $2^n$ rows and 4 columns (i.e., $2^n \times 4$ bit-cells or $2^n$ 4-bit words are programmable). In general, an EPROM receives an address (for both programming the EPROM and retrieving a word from it) in parallel, and provides a parallel data output. For example, in FIG. 1, a row address decoder 101 accepts an n-bit address 110 as input and activates one of its $2^n$ output lines 120 connected to respective $2^n$ rows of the EPROM. Depending on which one of the $2^n$ output lines 120 is chosen, one of the corresponding row among the $2^n$ rows of the EPROM is addressed. Using four 1-bit registers 102, 103, 104 and 105 which hold 4 bits, 4 bit-cells of an activated row, e.g., the first row 120-1, is programmed in parallel (i.e., simultaneously).

FIG. 2 illustrates a basic structure of an EPLD 200. Despite a stricter requirement for pin minimization on EPLDs, compared to EPROMs, the number of bits that can be programmed simultaneously is much larger. This is because EPLDs' usage is mainly for reading out Boolean function values rather than reading or programming the device memory's contents, therefore allowing programming (which rarely happens) be performed on more bits simultaneously. Similar to the programming of an EPROM, one row of EPLD 200 is activated, for example, using a row address shift register 201. To program an EPLD of the same size (i.e., $2^n \times 4$ bit-cells) as the EPROM of FIG. 1, row address shift register 201 contains a bit pattern consisting of one '1' bit and $(2^n-1)$ '0' bits, where the position of the single '1' bit designates which row is to be activated for programming. For example, a '1' bit at the j-th position of row address shift register 201 activates the j-th line 220-j, which in turn activates the j-th row of the EPLD matrix. The rows of EPLD 200 are sequentially accessed by clocking the shift register 201. When a certain row is activated, the programming data is loaded serially via four 1-bit data shift registers 202, 203, 204 and 205 for that particular row alone. This limitation results in serial programming of data. As a consequence, for such EPLDs, programming becomes time-consuming.

In FIGS. 1 and 2, EPROM 100 and EPLD 200 each has only 4 columns to facilitate explanation. In practice, the number of columns of an EPROM or an EPLD is far greater than 4, e.g., 128 columns. Also, the structures respectively related to output of programmed words from EPROM 100 and EPLD 200 are omitted from FIGS. 1 and 2. One skilled in the art would understand how to output data from EPROMs and EPLDs.

Time required for programming limits the number of EPLDs that can be tested. An EPLD is typically programmed with ten, twenty or even more programming patterns during a test (i.e., many more than an EPROM would require). Thus, the time required to program the device may constitute almost all the time actually spent on the test. Therefore, a faster method of programming an EPLD can be of great savings.

Several schemes have been developed to speed up the programming of EPLDs. First, it is possible to activate several rows of an EPLD and program them simultaneously, if the rows are to be programmed with the same bit pattern. Usually such a multiple-row programming takes no more time than a single-row programming. If the programming pattern (i.e., pattern matrix) includes a large number of identical row patterns, the savings in programming time can be substantial.

Another scheme heretofore employed involves the "walking" a '1' bit through the four data shift registers 202–205 of FIG. 2, serially activating the corresponding columns 206–209, respectively, while different sets of row addresses are enabled. In general, this method is more efficient than the traditional method only when there are much more rows than there are columns.

A more efficient method for programming EPLDs is needed.

SUMMARY

In accordance with the present invention, a method for reducing the time to program an EPLD using a basis set of the desired rows of programming pattern is described. For given row patterns (hereinafter "pattern matrix"), a basis set is a set of row patterns from which all of the row patterns can be derived using one or more Boolean operations. A minimal basis set of a given pattern matrix is a basis set with the smallest number of members (i.e., row patterns). A row of an EPLD is programmed by loading a row pattern. In accordance with this invention, row patterns of a basis set are loaded one row pattern at a time into as many rows of the EPLD as possible simultaneously. When a given row of the EPLD receives more than one row pattern, the multiple programming has the effect of programming the row of the EPLD with a result of applying a Boolean OR operation on the multiple row patterns. Since the number of row patterns in a basis set is, in most cases, less than the number of rows of the pattern matrix, the overall process takes significantly less time than programming the rows using most prior art methods. The time saving is particularly significant when a minimal basis set is used.

DETAILED DESCRIPTION

Figure 1:
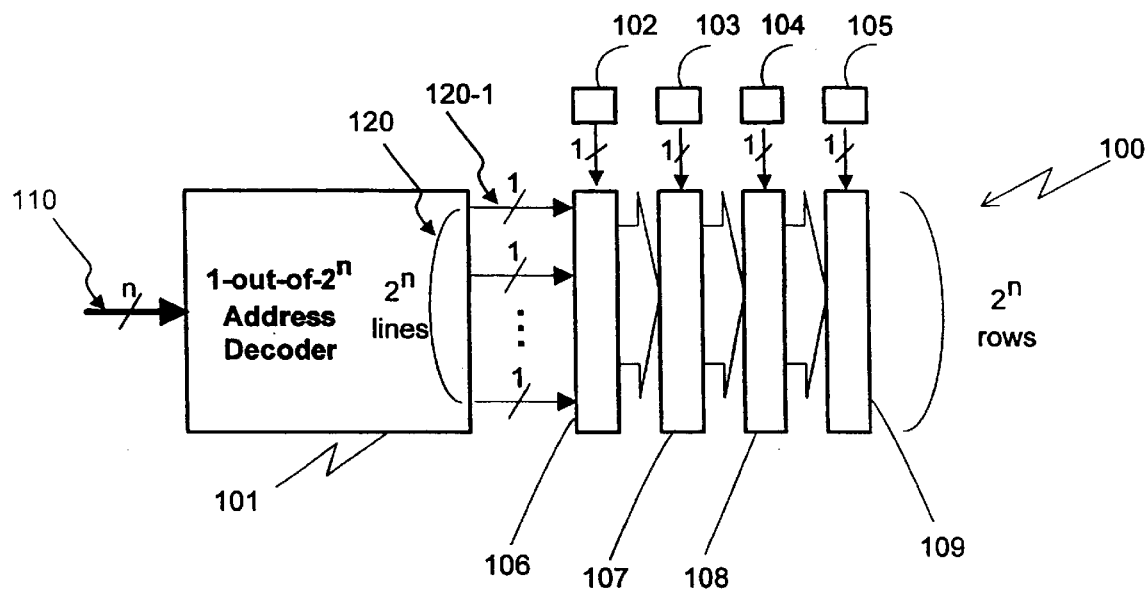
FIG. 1 illustrates a representative EPROM design 100 with a 1-out-of-$2^n$ row address decoder 101, four 1-bit data registers 102–105 and EPROM matrix columns 106–109.
Figure 2:
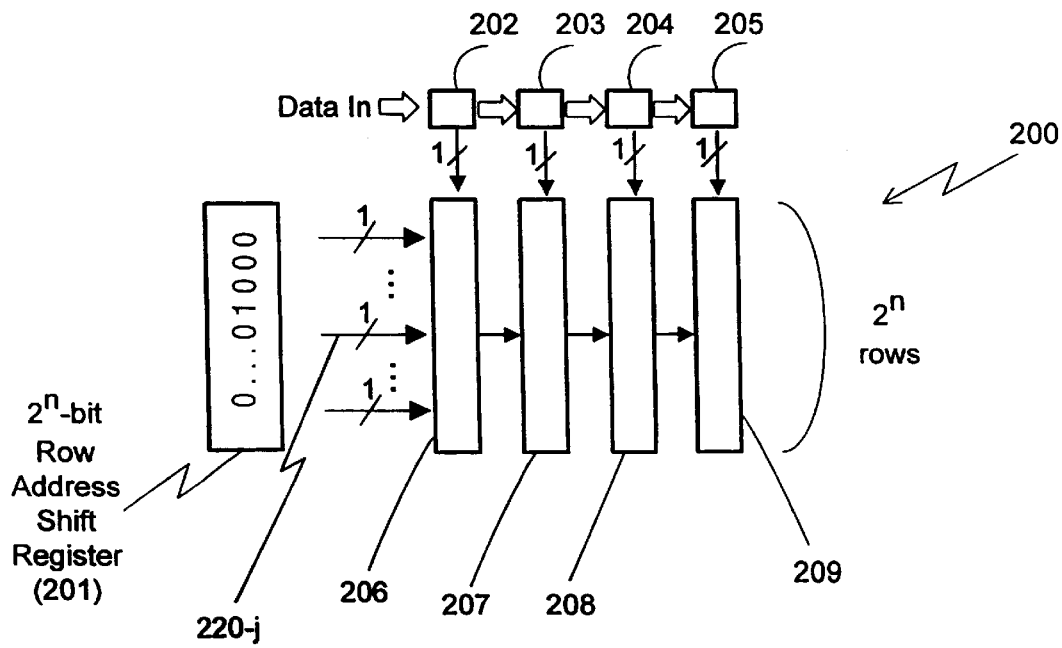
FIG. 2 illustrates a representative EPLD design 200 differing from an EPROM design due to constraint on the number of pins. The illustrated EPLD 200 has a row address shift register 201, four 1-bit data shift registers 202–205, and EPLD matrix columns 206–209.

There are two types of EPLDs: in one type, an unprogrammed cell is defaulted to logic '0' and programming sets the bit to '1', if appropriate. In the other type, an unprogrammed bit is defaulted to logic '1' and programming sets the bit to '0', if appropriate. In the first type, if a row of an EPLD is programmed multiple times with different row patterns, the result is a row pattern which is the logical "sum" (i.e., logical "ORing") of the different row patterns. In EPLDs where programming is accomplished by setting '1' bits to '0' bits, all the programmable bits are initialized to '1' before programming. Here, if a row of an EPLD is programmed multiple times with multiple row patterns, the result is a row pattern which is the logical "product" (i.e., bit-wise logical "ANDing") of the row patterns.

In this detailed description, the present invention is illustrated using examples of EPLDs in which programming is accomplished by setting selected '0' bits to '1' bits. One skilled in the art will appreciate that the present invention can be applied to EPLDs where programming is achieved by setting '1' bits to '0' bits using analogous procedures.

Now consider the following three row patterns A, B and C to be used respectively to program three rows 1, 2 and 3 of an EPLD: (For example, EPLD shown in FIG. 5)

| | |
|---|---|
| A: | 00000001000000100000100000100101000001000010000 |
| B: | 01001010001001000100001000001000001000010000010 |
| C: | 01001011001001100100101000011010100100101001010010010 |

Inspection of row patterns A, B and C reveals that row pattern C is the logical sum (i.e., ORing) of row patterns A and B. Thus, row 3 can be programmed in two steps, by first loading row pattern A simultaneously into rows 1 and 3, and then loading row pattern B simultaneously into rows 2 and 3. As a result, instead of having to load three times, loading twice suffices. Therefore significant programming time can be saved by utilizing the fact that some row patterns can be expressed as logical sums of other row patterns. The described method can be further improved by using row patterns that need not be found in any row of the pattern matrix.

Following pattern matrix is a different example to illustrate this improvement:

| | |
|---|---|
| A: | 10010110011001011001100101100110010110011001011001 |
| B: | 00000001000000000100000000010000000001000000000100 |
| C: | 01111001110111100111011110011101111001110111100111 |
| D: | 11111110111111111011111111101111111110111111111011 |
| E: | 11111111011111111110111111111101111111111011111111101 |
| F: | 00000000100000000010000000001000000000100000000010 |
| G: | 11111101111111110111111111101111111110111111111101 |
| H: | 00000010000000001000000000100000000010000000001000 |
| I: | 11111011111111101111111110111111111011111111101111 |
| J: | 00000100000000010000000001000000000100000000010000 |
| K: | 11110111111110111111111011111111101111111110111111 |
| L: | 00001000000000100000000010000000001000000000100000 |
| M: | 11101111111101111111110111111111011111111101111111 |
| N: | 00010000000010000000001000000000100000000010000000 |
| O: | 11011111111011111111101111111110111111111011111111 |
| P: | 00100000000100000000010000000001000000000100000000 |
| Q: | 10111111110111111111011111111101111111110111111111 |
| R: | 01000000001000000000100000000010000000001000000000 |
| S: | 01111111101111111110111111111011111111110111111111 |
| T: | 10000000001000000001000000000100000000010000000000 |

A careful inspection of the above pattern matrix reveals that 12 row patterns A, B, C, F, H, J, L, M, N, P, R and T are "primitive" in that each of the 12 row patterns cannot be derived from other row patterns and the other eight rows patterns can be derived from a subset of these 12 row patterns. For example, row pattern D can be derived as the logical sum of row patterns A, F, L, P and R. Now, let us consider a row pattern U as follows, which is not found in the pattern matrix:

| | |
|---|---|
| U: | 00000000010000000001000000000100000000010000000001 |

By including row pattern U in a basis set, any of the row patterns A–T can now be generated from a smaller set of row patterns: B, F, H, J, L, N, P, R, T and U. In this instance, a total of ten primitive row patterns will suffice to do all programming, which is less than the previous 12 primitive row patterns.

Thus, it is observed that the row patterns to be loaded into the EPLD can be decomposed into a set of primitive row patterns (each of which need not occur in the pattern matrix). Each of these primitive row patterns is referred to as a "basis" by analogy with the theory of vector spaces. More than one basis set that derives a given pattern matrix may exist, some basis sets having less members than others. Although a substantial savings can be realized even with a non-minimal basis set, programming with a minimal basis set (i.e., a basis set with the smallest number of rows) results in the least programming time. A minimal basis set can be found either exhaustively, or by the method described below.

Figure 3:
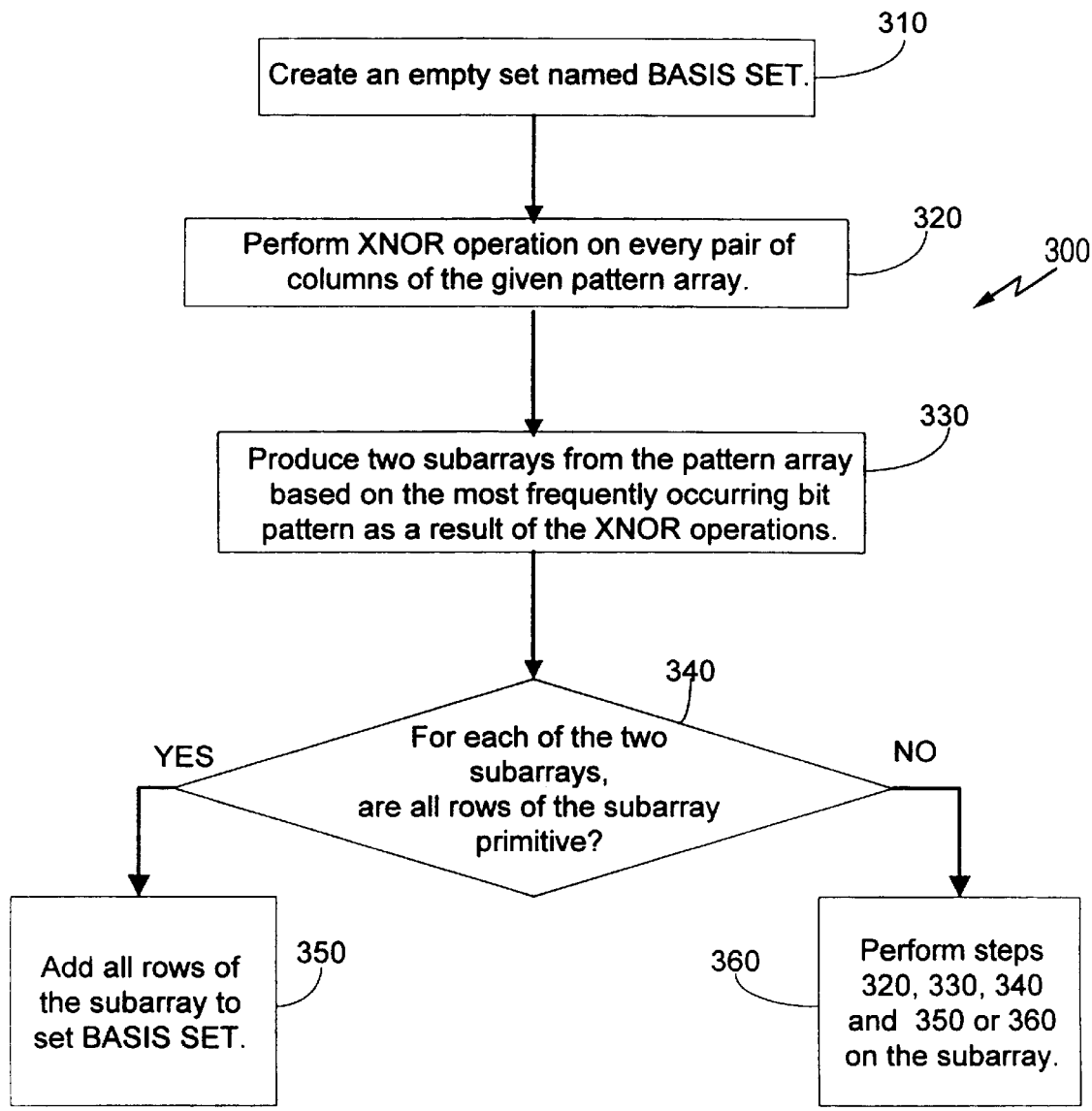
FIG. 3 illustrates steps 310–360 for finding a minimal basis set of a given pattern matrix.

FIG. 3 illustrates steps 310–360 (which roughly correspond to steps 1–4 below) for finding a minimal basis set, given an m×n pattern matrix, i.e., m row patterns with n bits each:

Step 1: Create an empty set named BASIS SET.

Step 2: Perform an XNOR operation on every possible pair of n columns of the pattern matrix.

Step 3: Select the most frequently occurring m-bit XNOR result, line up the XNOR result with the pattern matrix as if the m-bit result is the (n+1)-th column of the pattern matrix, and use the bit pattern of the result to derive two subsets of row patterns as follows:
  (1) For each row pattern corresponding to a bit position of '1' in the most frequent XNOR result, place the row pattern in the first subset of row patterns; and
  (2) place all other row patterns (corresponding to '0' bits in the result) in the second subset.

Step 4: For each subset, if all rows in a subset of row patterns are primitive, the subset is "irreducible"; otherwise the subset is "reducible". Each row patterns in the irreducible subset is added to the BASIS SET unless the row pattern is already in the BASIS SET. If the subset is reducible, Steps 2–4 are performed on the subset.

Although the steps above are described as a recursive procedure, it is understood by those skilled in the art that a recursive process can be implemented iteratively. The above process groups row patterns into successively smaller subsets, from which primitive row patterns are found and added to the BASIS SET.

The method described above can be improved to find a minimal basis set more quickly by replacing Step 2 above with the following steps:
2.1: Delete all columns with no '1' bit.
2.2: Delete duplicate columns in the n×m matrix and leaving only the unique columns.
2.3: Perform an XNOR operation on every possible pair of columns in the matrix.

Figure 4:
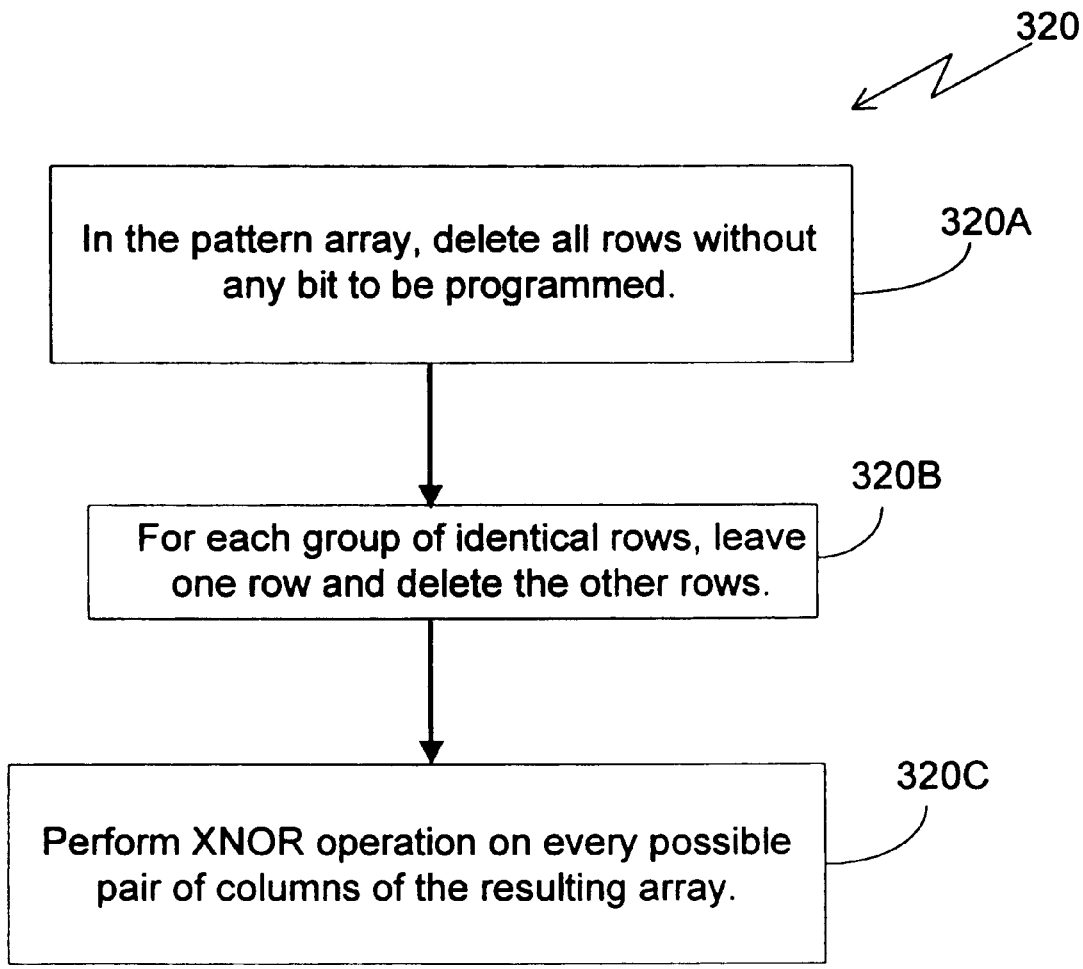
FIG. 4 illustrates substeps 320A–320C for carrying out step 320 of performing XNOR operations, which is one of the steps shown in FIG. 3.

The above steps 2.1–2.3 are respectively illustrated in FIG. 4 as steps 320A–320C.

The following steps illustrate a detailed example of the present invention, which further includes additional steps that make the overall process of finding a minimal basis set quicker for a given pattern matrix.

Step 3.1: Create an empty set named BASIS SET.
Step 3.2: Label each row of the pattern matrix with a membership set, whose single element is the identification (ID) number of the row, e.g., the first row of the pattern matrix is labeled as {0}.
Step 3.3: Delete the rows in the pattern matrix consisting only of '0' bits (i.e., rows that do not need any programming) and call the resulting matrix Z.
Step 3.4: Create a matrix R by eliminating duplicate rows from matrix Z, and then label each remaining unique row pattern of matrix R with an updated membership set consisting of the ID numbers of identical row patterns. For example, if there were rows 1, 2 and 4 with pattern 11110101 in matrix Z, delete two redundant rows (e.g., rows 2 and 4) of matrix Z and tag the remaining row pattern in matrix R with membership set {1, 2, 4}.
Step 3.5: From matrix R, move each row pattern ("single-l-bit row") with a single '1' bit (e.g., 00010000), which is clearly primitive, to set BASIS SET if the row pattern is not already a member of BASIS SET.
Step 3.6: For each single-1-bit row, in all other rows of matrix R, set to '0' the bit corresponding to the '1' bit of the single-bit row. For example, if a single-1-bit row had pattern 00001000, then change a row pattern 11111110 of matrix R to 11110110.
Step 3.7: Repeat steps 3.4–3.6 until no duplicate rows and single-bit rows exist. Call the resulting matrix D.
Step 3.8: Delete all columns without any 1 bit (step 3.8.1), tag each column of matrix D with the column's bit position (step 3.8.2), eliminate duplicate columns from matrix D (step 3.8.3), and express the bit positions of the eliminated duplicate columns together with remaining unique column's bit position (step 3.8.4). Call the resulting matrix D'.

For example, if D were an 8×6 matrix:
111101
011001
011001
011101
101101
011001
011101
001001,
performing Steps 3.8.1–3.8.4 results in matrix D':

| bit 0 | bit 1 | bit 2/5 | bit 3 |
|-------|-------|---------|-------|
| 1 | 1 | 1 | 1 |
| 0 | 1 | 1 | 0 |
| 0 | 1 | 1 | 0 |
| 0 | 1 | 1 | 1 |
| 1 | 0 | 1 | 1 |
| 0 | 1 | 1 | 0 |
| 0 | 1 | 1 | 1 |
| 0 | 0 | 1 | 0. |

The column tagged "bit 4" was deleted in step 3.8.1, since it contains no pattern to be programmed. The columns tagged "bit 2" and "bit 5" became a single row due to elimination of duplicates (in step 3.8.3), and is tagged with "bit 2/5" (in step 3.8.4).

Step 3.9: Perform an XNOR operation between every pair of columns of matrix D'. XNOR operation of two bits results in 1 when two bits are the same and 0 when two bits differ. The 4 columns in matrix D' will produce 6 XNOR results from 6 possible pairings of rows. For example, the first two columns (transposed into rows below for convenience) are XNORed as follows:

```
10001000
11110110
------------
10000001
```

Step 3.10: Order the XNOR results in decreasing order of frequency, i.e., with the most frequently occurring pattern being the first and the least frequently occurring pattern the last. (Not all XNOR results will be unique, occurring repeatedly. For example, if pattern A occurred 7 times, pattern B occurred 4 times and pattern C 3 times, the three patterns will be ordered as A B C.)

Step 3.11: Delete any XNOR pattern whose number of occurrences is less than the number of 1's in the pattern. For example, if pattern 11010001 as an XNOR result occurred 3 times (less than 4, which is the number of 1's in the pattern), this pattern is discarded.

Step 3.12: Each resulting XNOR pattern suggests a way to split row patterns of matrix D to form two matrices D1 and D2 such that row patterns corresponding to 1's in an XNOR pattern belong to D1 and row patterns corresponding to 0's belong to D0. For example, XNOR pattern 01111110 suggests that the first row pattern and the eighth row pattern should be put in matrix D0, and the rest of the row patterns in matrix D1. One heuristic rule chooses the most frequently occurring XNOR pattern for splitting matrix D.

Step 3.13: For each of matrices D0 and D1, one of three possible situations can arise:

Case A: Both matrices are irreducible. All of the rows of both matrices are then included in BASIS SET.

Case B: Both matrices are reducible. Then, for each matrix, repeat Steps 3.8–3.13.

Case C: One matrix is irreducible and the other matrix is reducible. Then
(1) repeat steps 3.8–3.13 on the reducible matrix; and
(2) add all the row patterns of the irreducible matrix to the BASIS SET without redundancy.

The above steps are implemented in a C program listed in Appendix A, a microfiche.

Figure 5:
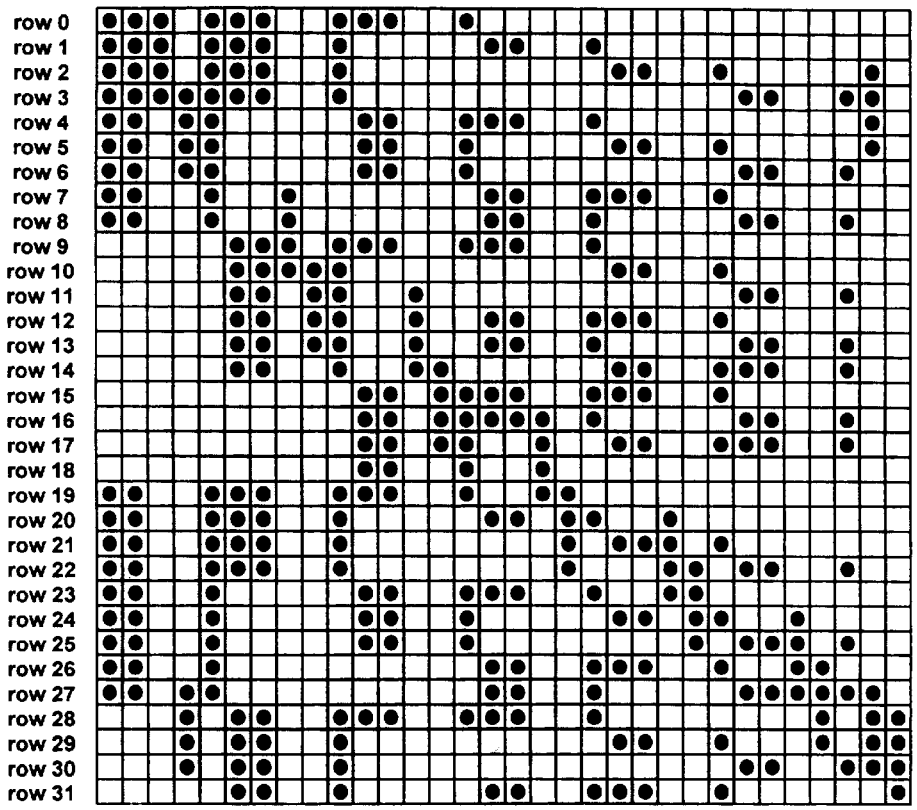
FIG. 5 illustrates a 32×32 pattern matrix 500.
Figure 6:
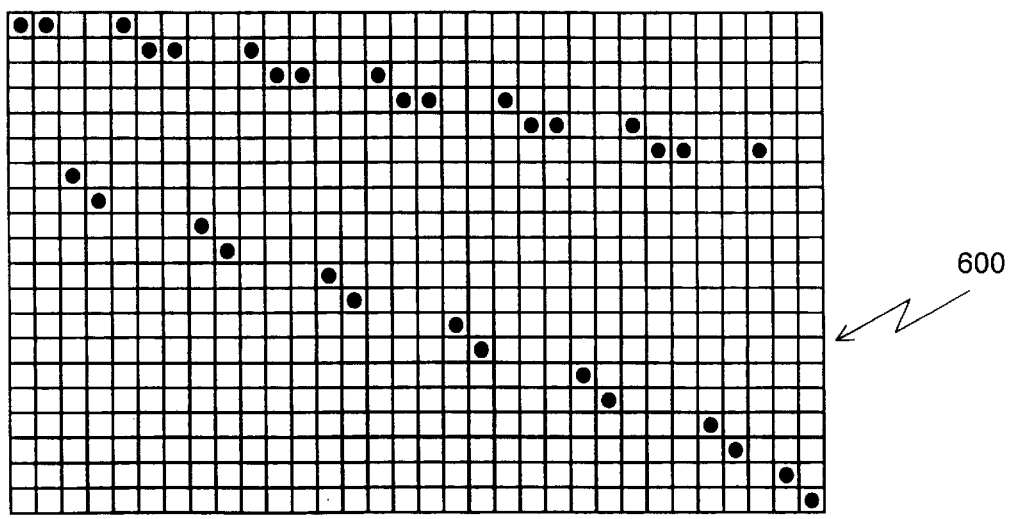
FIG. 6 illustrates a 20×32 basis set matrix 600 of the pattern matrix shown in FIG. 5.

FIG. 5 shows a 32×32 pattern matrix 500 for programming a portion of an EPLD. Each cell with a "dot" in pattern matrix 500 represents an EPLD bit-cell to be programmed to '1' and each one without a "dot" represents a cell to be programmed to '0'. Since no two row patterns in pattern 500 are identical, no time savings can be realized by the prior art method of programming identical rows simultaneously. Also, the prior art method of serially programming each column of pattern matrix 500 will require 32 programming operations, i.e., no savings, since the matrix does not have fewer columns than it has rows . Finally, since no row can be derived from other two or more rows, it will not be possible to express any row as the sum of other rows. However, with the choice of 20 basis row patterns 600 shown in FIG. 6, the number of programming operations becomes 20 (instead of 32).

Even though the finding a minimal basis set is computationally costly, the computational effort is justified in a manufacturing environment, since the basis set patterns are applied to an unlimited number of EPLDs produced, which can number in the millions. Consequently, the time savings in testing of the numerous EPLDs can be very significant.

The above detailed description is provided to illustrate specific embodiments of the present invention and is not intended to be limiting. Although described using an EPLD as an example, the present invention is applicable also to PLDs and any device that is programmable by the invention. Numerous modifications and variations within the scope of the present invention are possible. The present invention is defined by the following claims.

What is claimed is:

1. A process for programming a programmable logic device (PLD) with a plurality of row patterns, the process comprising the steps of:

finding a basis set for the row patterns using Boolean operations, the basis set including a plurality of patterns selected such that each of the row patterns is either a pattern in the basis set or derivable from one or more of the patterns in the basis set by performing Boolean operations;

selecting one or more patterns in the basis set; and for each selected pattern, programming simultaneously all rows of the PLD having a row pattern, which is either identical with the selected pattern or derivable from the selected pattern using Boolean operation.

2. The process of claim 1, wherein the PLD is an erasable programmable logic device.

3. The process of claim 1, wherein the basis set is a minimal basis set.

4. The process of claim 3, wherein the minimal basis set is found by a method comprising:

creating a set that is initially empty;

creating a matrix comprising the row patters performing an XNOR operation on every pair of columns of said matrix, each XNOR operation resulting in a bit pattern; and deriving two submatrices from the matrix using a bit pattern resulting from the step of performing.

5. The process of claim 4, wherein the method further comprises:

adding a row of one of the two submatrices as a pattern to the set if the row is not derivable from two or more rows in that one of the two submatrices using a Boolean operation; and recursively applying the steps of performing, deriving, adding and applying to each of the two submatrices until that submatrix contains only rows which are patterns already in the set.

6. The method of claim 4, wherein the method further comprises:

deleting all columns of the matrix which do not have any bit to be used for programming; and for each group of identical columns, leaving one column and deleting any other duplicate column.

7. The process of claim 4, wherein the method further comprises:

after the step of performing an XNOR operation, eliminating every bit pattern that occurs fewer times than the number of '1' bits appearing in the bit pattern.

* * * * *

UNITED STATES PATENT AND TRADEMARK OFFICE
CERTIFICATE OF CORRECTION

PATENT NO. : 6,134,703
DATED : October 17, 2000
INVENTOR(S) : Ernest Allen

It is certified that error appears in the above-identified patent and that said Letters Patent is hereby corrected as shown below:

Column 8,
Line 32, delete "recursively"; and
Line 33, after "and" insert -- recursively --.

Signed and Sealed this

Ninth Day of July, 2002

*Attest:*

*Attesting Officer*

JAMES E. ROGAN
*Director of the United States Patent and Trademark Office*